United States Patent
Campbell et al.

(10) Patent No.: US 7,961,475 B2
(45) Date of Patent: *Jun. 14, 2011

(54) APPARATUS AND METHOD FOR FACILITATING IMMERSION-COOLING OF AN ELECTRONIC SUBSYSTEM

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Vinod Kamath, Raleigh, NC (US); Robert E. Simons, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 245 days.

This patent is subject to a terminal disclaimer.

(21) Appl. No.: 12/256,618

(22) Filed: Oct. 23, 2008

(65) Prior Publication Data

US 2010/0101759 A1 Apr. 29, 2010

(51) Int. Cl.
*H05K 1/00* (2006.01)
*H05K 7/20* (2006.01)
*H05K 5/00* (2006.01)
*H01R 13/40* (2006.01)
*H02B 1/01* (2006.01)
*F28F 7/00* (2006.01)
*F25D 23/12* (2006.01)

(52) U.S. Cl. ........ 361/748; 361/699; 361/724; 361/752; 165/80.4; 439/559; 439/587; 62/259.2

(58) Field of Classification Search .......... 439/559, 439/587; 62/259.2; 165/80.4
See application file for complete search history.

(56) References Cited

U.S. PATENT DOCUMENTS 2,125,888 A 8/1938 Cordrey
(Continued)

FOREIGN PATENT DOCUMENTS

DE 101 12 389 A1 10/2002
(Continued)

OTHER PUBLICATIONS

Campbell et al., "Liquid-Based Cooling Apparatus for an Electronics Rack", U.S. Appl. No. 11/763,678, filed Jun. 15, 2007.

(Continued)

*Primary Examiner* — Jayprakash N Gandhi
*Assistant Examiner* — Bradley H Thomas
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method are provided for facilitating immersion-cooling of an electronic subsystem having multiple different types of components to be immersion-cooled. The apparatus includes a container sized to receive the electronic subsystem, and a hermetically sealed electrical connector disposed on a wall of the container. The electrical connector is sized and configured to receive an electrical and network connector of the electronic subsystem when the electronic subsystem is operatively inserted into the container, and to facilitate external electrical and network coupling to the subsystem. The apparatus further includes coolant inlet and outlet ports coupled to the container for facilitating ingress and egress of coolant through the container. When the electronic subsystem is operatively inserted into the container and coolant flows through the container, the electronic subsystem is immersion-cooled by the coolant.

20 Claims, 8 Drawing Sheets

U.S. PATENT DOCUMENTS

| | | | |
|---|---|---|---|
| 2,512,545 A | 6/1950 | Hazard | |
| 2,548,325 A | 4/1951 | Smith | |
| 2,643,282 A | 6/1953 | Green | |
| 2,791,888 A | 5/1957 | Vani | |
| 3,109,485 A | 11/1963 | Fortier | |
| 3,143,592 A | 8/1964 | August | |
| 3,226,941 A | 1/1966 | Snelling | |
| 3,404,730 A | 10/1968 | Kurisu | |
| 3,476,175 A | 11/1969 | Plevyak | |
| 3,512,582 A | 5/1970 | Chu et al. | |
| 3,578,014 A | 5/1971 | Gachot | |
| 3,586,101 A | 6/1971 | Chu et al. | |
| 3,600,636 A * | 8/1971 | Petersen | 361/689 |
| 3,609,991 A | 10/1971 | Chu et al. | |
| 3,774,677 A | 11/1973 | Antonetti et al. | |
| 3,858,090 A * | 12/1974 | Lehmann | 361/699 |
| 4,064,300 A | 12/1977 | Bhangu | |
| 4,108,242 A | 8/1978 | Searight et al. | |
| 4,201,195 A | 5/1980 | Sakhuja | |
| 4,302,793 A * | 11/1981 | Rohner | 361/699 |
| 4,430,866 A | 2/1984 | Willitts | |
| 4,590,538 A | 5/1986 | Cray, Jr. | |
| 4,619,316 A * | 10/1986 | Nakayama et al. | 165/104.33 |
| 4,622,946 A | 11/1986 | Hurley et al. | |
| 4,694,378 A * | 9/1987 | Nakayama et al. | 361/700 |
| 4,704,658 A * | 11/1987 | Yokouchi et al. | 361/698 |
| 4,741,385 A * | 5/1988 | Bergles et al. | 165/104.29 |
| 4,750,086 A | 6/1988 | Mittal | |
| 4,912,600 A | 3/1990 | Jaeger et al. | |
| 4,928,206 A * | 5/1990 | Porter et al. | 361/699 |
| 4,928,207 A | 5/1990 | Chrysler et al. | |
| 4,962,444 A * | 10/1990 | Niggemann | 361/702 |
| 5,021,924 A | 6/1991 | Kieda et al. | |
| 5,057,968 A * | 10/1991 | Morrison | 361/700 |
| 5,063,476 A | 11/1991 | Hamadah et al. | |
| 5,067,047 A | 11/1991 | Azar | |
| 5,126,919 A | 6/1992 | Yamamoto et al. | |
| 5,168,348 A | 12/1992 | Chu et al. | |
| 5,183,104 A | 2/1993 | Novotny | |
| 5,220,804 A | 6/1993 | Tilton et al. | |
| 5,270,572 A | 12/1993 | Nakajima et al. | |
| 5,274,530 A * | 12/1993 | Anderson | 361/689 |
| 5,305,184 A * | 4/1994 | Andresen et al. | 361/699 |
| 5,349,831 A | 9/1994 | Daikoku et al. | |
| 5,406,807 A * | 4/1995 | Ashiwake et al. | 62/376 |
| 5,414,592 A * | 5/1995 | Stout et al. | 361/704 |
| 5,458,185 A | 10/1995 | Mizuno | |
| 5,467,250 A | 11/1995 | Howard et al. | |
| 5,491,363 A | 2/1996 | Yoshikawa | |
| 5,675,473 A | 10/1997 | McDunn et al. | |
| 5,687,577 A | 11/1997 | Ballard et al. | |
| 5,718,117 A | 2/1998 | McDunn et al. | |
| 5,782,101 A | 7/1998 | Dennis | |
| 5,825,621 A * | 10/1998 | Giannatto et al. | 361/701 |
| 5,829,264 A | 11/1998 | Ishigaki et al. | |
| 5,854,092 A | 12/1998 | Root et al. | |
| 5,860,602 A | 1/1999 | Tilton et al. | |
| 5,864,466 A | 1/1999 | Remsburg | |
| 5,880,931 A | 3/1999 | Tilton et al. | |
| 5,907,473 A | 5/1999 | Przilas et al. | |
| 5,943,211 A | 8/1999 | Havey et al. | |
| 5,959,351 A | 9/1999 | Sasaki et al. | |
| 5,963,425 A | 10/1999 | Chrysler et al. | |
| 5,970,731 A | 10/1999 | Hare et al. | |
| 6,000,908 A | 12/1999 | Bunker | |
| 6,016,969 A | 1/2000 | Tilton et al. | |
| 6,019,167 A * | 2/2000 | Bishop et al. | 165/104.33 |
| 6,026,565 A * | 2/2000 | Giannatto et al. | 29/830 |
| 6,052,284 A | 4/2000 | Suga et al. | |
| 6,055,157 A * | 4/2000 | Bartilson | 361/699 |
| 6,139,361 A * | 10/2000 | Przilas et al. | 439/559 |
| 6,173,577 B1 * | 1/2001 | Gold | 62/51.1 |
| 6,193,905 B1 | 2/2001 | Yamada et al. | |
| 6,205,799 B1 | 3/2001 | Patel et al. | |
| 6,212,895 B1 | 4/2001 | Richardson | |
| 6,320,744 B1 * | 11/2001 | Sullivan et al. | 361/679.34 |
| 6,349,554 B2 | 2/2002 | Patel et al. | |
| 6,366,462 B1 | 4/2002 | Chu et al. | |
| 6,378,605 B1 | 4/2002 | Kutscher et al. | |
| 6,392,891 B1 * | 5/2002 | Tzlil et al. | 361/719 |
| 6,393,853 B1 * | 5/2002 | Vukovic et al. | 62/259.2 |
| 6,404,640 B1 | 6/2002 | Ishimine et al. | |
| 6,431,260 B1 | 8/2002 | Agonafer et al. | |
| 6,457,321 B1 | 10/2002 | Patel et al. | |
| 6,462,941 B1 | 10/2002 | Hulick et al. | |
| 6,519,151 B2 | 2/2003 | Chu et al. | |
| 6,536,510 B2 | 3/2003 | Khrustalev et al. | |
| 6,571,569 B1 | 6/2003 | Rini et al. | |
| 6,574,104 B2 | 6/2003 | Patel et al. | |
| 6,581,388 B2 * | 6/2003 | Novotny et al. | 62/3.7 |
| 6,616,469 B2 * | 9/2003 | Goodwin et al. | 439/196 |
| 6,621,707 B2 * | 9/2003 | Ishimine et al. | 361/721 |
| 6,644,058 B2 | 11/2003 | Bash et al. | |
| 6,646,879 B2 | 11/2003 | Pautsch | |
| 6,807,056 B2 | 10/2004 | Kondo et al. | |
| 6,817,196 B2 | 11/2004 | Malone et al. | |
| 6,828,675 B2 | 12/2004 | Memory et al. | |
| 6,927,980 B2 | 8/2005 | Fukuda et al. | |
| 6,955,062 B2 | 10/2005 | Tilton et al. | |
| 6,973,801 B1 | 12/2005 | Campbell et al. | |
| 6,976,528 B1 | 12/2005 | Tilton et al. | |
| 7,011,143 B2 | 3/2006 | Corrado et al. | |
| 7,012,807 B2 | 3/2006 | Chu et al. | |
| 7,057,893 B2 | 6/2006 | Nicolai et al. | |
| 7,079,393 B2 | 7/2006 | Colgan et al. | |
| 7,088,585 B2 | 8/2006 | Chu et al. | |
| 7,104,078 B2 | 9/2006 | Tilton | |
| 7,106,590 B2 | 9/2006 | Chu et al. | |
| 7,134,289 B2 | 11/2006 | Patel et al. | |
| 7,143,605 B2 | 12/2006 | Rohrer et al. | |
| 7,187,549 B2 | 3/2007 | Teneketges et al. | |
| 7,191,954 B2 | 3/2007 | Kline | |
| 7,222,502 B2 | 5/2007 | Kobayashi et al. | |
| 7,233,491 B2 | 6/2007 | Faneuf et al. | |
| 7,251,139 B2 | 7/2007 | Bhattacharya et al. | |
| 7,252,100 B1 * | 8/2007 | Downes et al. | 134/111 |
| 7,258,161 B2 | 8/2007 | Cosley et al. | |
| 7,272,005 B2 | 9/2007 | Campbell et al. | |
| 7,285,851 B1 | 10/2007 | Cepeda-Rizo et al. | |
| 7,286,356 B2 | 10/2007 | Keenan et al. | |
| 7,295,436 B2 | 11/2007 | Cheon | |
| 7,295,440 B2 | 11/2007 | Ganev et al. | |
| 7,309,209 B2 | 12/2007 | Amiot et al. | |
| 7,349,213 B2 | 3/2008 | Campbell et al. | |
| 7,355,852 B2 * | 4/2008 | Pfahnl | 361/699 |
| 7,362,574 B2 | 4/2008 | Campbell et al. | |
| 7,365,973 B2 | 4/2008 | Rasmussen et al. | |
| 7,372,698 B1 | 5/2008 | Tilton et al. | |
| 7,375,962 B2 | 5/2008 | Campbell et al. | |
| 7,380,409 B2 | 6/2008 | Campbell et al. | |
| 7,385,810 B2 | 6/2008 | Chu et al. | |
| 7,392,660 B2 | 7/2008 | Tilton et al. | |
| 7,392,823 B2 | 7/2008 | Dong et al. | |
| 7,400,505 B2 | 7/2008 | Campbell et al. | |
| 7,403,392 B2 | 7/2008 | Attlesey et al. | |
| 7,408,776 B2 | 8/2008 | Campbell et al. | |
| 7,414,845 B2 | 8/2008 | Attlesey et al. | |
| 7,420,808 B2 | 9/2008 | Campbell et al. | |
| 7,428,151 B2 | 9/2008 | Sonnabend et al. | |
| 7,436,666 B1 | 10/2008 | Konshak | |
| 7,450,384 B2 * | 11/2008 | Tavassoli et al. | 361/699 |
| 7,450,385 B1 | 11/2008 | Campbell et al. | |
| 7,466,549 B2 | 12/2008 | Dorrich et al. | |
| 7,477,513 B1 | 1/2009 | Cader et al. | |
| 7,477,514 B2 | 1/2009 | Campbell et al. | |
| 7,495,914 B2 | 2/2009 | Tilton et al. | |
| 7,531,142 B2 | 5/2009 | Huziwara et al. | |
| 7,559,207 B2 | 7/2009 | Knight et al. | |
| 7,602,608 B2 | 10/2009 | Tilton et al. | |
| 7,609,518 B2 * | 10/2009 | Hopton et al. | 361/699 |
| 7,630,795 B2 | 12/2009 | Campbell et al. | |
| 7,639,499 B1 | 12/2009 | Campbell et al. | |
| 7,641,101 B2 | 1/2010 | Campbell et al. | |
| 7,654,100 B2 | 2/2010 | Rini et al. | |
| 7,660,109 B2 | 2/2010 | Iyengar et al. | |
| 7,724,524 B1 | 5/2010 | Campbell et al. | |
| 2002/0062945 A1 | 5/2002 | Hocker et al. | |

| | | | |
|---|---|---|---|
| 2003/0230401 | A1 | 12/2003 | Pfister et al. |
| 2004/0008490 | A1* | 1/2004 | Cheon .......................... 361/699 |
| 2004/0057211 | A1* | 3/2004 | Kondo et al. ................. 361/696 |
| 2005/0207116 | A1 | 9/2005 | Yatskov et al. |
| 2005/0244280 | A1 | 11/2005 | Malone et al. |
| 2005/0254214 | A1* | 11/2005 | Salmon ......................... 361/699 |
| 2006/0126296 | A1 | 6/2006 | Campbell et al. |
| 2006/0162365 | A1 | 7/2006 | Hoang et al. |
| 2006/0180300 | A1 | 8/2006 | Lenehan et al. |
| 2007/0025081 | A1* | 2/2007 | Berlin et al. .................. 361/698 |
| 2007/0035937 | A1 | 2/2007 | Colbert et al. |
| 2007/0121295 | A1 | 5/2007 | Campbell et al. |
| 2007/0159797 | A1 | 7/2007 | Teneketges et al. |
| 2007/0193300 | A1* | 8/2007 | Tilton et al. ..................... 62/475 |
| 2007/0199204 | A1 | 8/2007 | Knight et al. |
| 2007/0199340 | A1* | 8/2007 | Knight et al. ................ 62/259.2 |
| 2007/0201210 | A1 | 8/2007 | Chow et al. |
| 2007/0227710 | A1 | 10/2007 | Belady et al. |
| 2007/0291452 | A1 | 12/2007 | Gilliland et al. |
| 2007/0295480 | A1 | 12/2007 | Campbell et al. |
| 2007/0297136 | A1 | 12/2007 | Konshak |
| 2008/0002363 | A1 | 1/2008 | Campbell et al. |
| 2008/0018212 | A1 | 1/2008 | Spearing et al. |
| 2008/0024991 | A1 | 1/2008 | Colbert et al. |
| 2008/0062639 | A1 | 3/2008 | Campbell et al. |
| 2008/0123297 | A1* | 5/2008 | Tilton et al. ................... 361/700 |
| 2008/0158818 | A1 | 7/2008 | Clidaras et al. |
| 2008/0196868 | A1* | 8/2008 | Attlesey et al. .......... 165/104.33 |
| 2008/0209931 | A1* | 9/2008 | Stevens ......................... 62/259.2 |
| 2008/0225478 | A1 | 9/2008 | Goettert et al. |
| 2009/0080173 | A1 | 3/2009 | Schmidt et al. |
| 2009/0086428 | A1 | 4/2009 | Campbell et al. |
| 2009/0086432 | A1 | 4/2009 | Campbell et al. |
| 2009/0126909 | A1 | 5/2009 | Ellsworth, Jr. et al. |
| 2009/0126910 | A1 | 5/2009 | Campbell et al. |
| 2009/0133866 | A1 | 5/2009 | Campbell et al. |
| 2009/0238235 | A1 | 9/2009 | Campbell et al. |
| 2009/0260777 | A1* | 10/2009 | Attlesey ........................... 165/67 |
| 2009/0268404 | A1 | 10/2009 | Chu et al. |
| 2009/0314467 | A1 | 12/2009 | Campbell et al. |
| 2009/0316360 | A1 | 12/2009 | Campbell et al. |
| 2010/0101765 | A1 | 4/2010 | Campbell et al. |
| 2010/0103614 | A1 | 4/2010 | Campbell et al. |
| 2010/0103618 | A1 | 4/2010 | Campbell et al. |
| 2010/0103620 | A1 | 4/2010 | Campbell et al. |
| 2010/0246118 | A1* | 9/2010 | Attlesey ................... 361/679.53 |

FOREIGN PATENT DOCUMENTS

| | | |
|---|---|---|
| JP | 8-254512 A | 10/1996 |
| JP | 2002-374086 | 12/2002 |
| WO | 2009/131810 | 10/2009 |

OTHER PUBLICATIONS

Iyengar et al., "Apparatus and Method for Facilitating Cooling of an Electronics System", U.S. Appl. No. 11/957,619, filed Dec. 17, 2007.
Goettert et al., "Heat Exchange System for Blade Server Systems and Method", U.S. Appl. No. 12/038,025, filed Feb. 27, 2008.
Chu et al., "Energy Efficient Apparatus and Method for Cooling and Electronics Rack", U.S. Appl. No. 12/108,020, filed Apr. 23, 2008.
Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).
Chef, B., "Supermicro Water Cooled Blades", Info World, Geeks in Paradise, (Mar. 5, 2008), http://weblog.infoworld.com/geeks/archives/2008/03.
Campbell et al., "Liquid Cooling Apparatus and Method of Facilitating Cooling of an Electronic System", U.S. Appl. No. 12/168,259, filed Jul. 7, 2008.
RD 323064 A, RD, Mar. 10, 1991.
Office Action for U.S. Appl. No. 12/256,631 (U.S. Patent Publication No. 2010/0103614 A1), dated Apr. 21, 2010.
"Notification of Transmittal of the International Search Report and the Written Opinion of the International Searching Authority, or the Declaration", International Application No. PCT/EP2009/060792, dated Dec. 23, 2009.
Hwang, U., "Heat Exchanger for Vapor Condensation by Dropwise Technique", IBM Technical Disclosure Bulletin, Publication No. IPCOM000089717D (Dec. 1, 1977).
Oktay et al., "Subcooled Flow Boiling with Flow Pattern Control", IBM Technical Disclosure Bulletin, Publication No. IPCOM000067827D (Oct. 1, 1979).
Hwang et al., "Evaporation Cooling Module", IBM Technical Disclosure Bulletin, Publication No. IPCOM000066472D (Mar. 1, 1979).
Delia et al., "System Cooling Design for the Water-Cooled IBM Enterprise System/900 Processors", IBM Journal of Research and Development, vol. 36, No. 4 pp. 791-803 (Jul. 1992).
Miyahara, M., "Small Fans for Cooling Small Electronic Devices", Electronics Cooling Magazine, online article retrieved from http://electronics-cooling.com/html/2009_may_techbrief.php (Aug. 31, 2009).
Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).
Zamanabadi et al., "Hybrid Control Challenges in Refrigeration Systems", Danfoss A/A, Denmark, Advanced Engineering—Refrigeration and Air Conditioning, EECI (2007).
Campbell et al., "Condenser Fin Structures Facilitating Vapor Condensation Cooling of Coolant", U.S. Appl. No. 12/491,286, filed Jun. 25, 2009.
Campbell et al., "Condenser Structures with Fin Cavities Facilitating Vapor Condensation Cooling of Coolant", U.S. Appl. No. 12/491,287, filed Jun. 25, 2009.
Campbell et al., "Apparatus and Method for Adjusting Coolant Flow Resistance Through Liquid-Cooled Electronics Rack(s)", U.S. Appl. No. 12/556,040, filed on Sep. 9, 2009.
Campbell et al., "Apparatus and Method with Forced Coolant Vapor Movement for Facilitating Two-Phase Cooling of an Electric Device", U.S. Appl. No. 12/565,175, filed Sep. 23, 2009.
Campbell et al., "Liquid-Cooled Electronics Apparatus and Methods of Fabrication", U.S. Appl. No. 12/556,081, filed Sep. 24, 2009.
Campbell et al., "Compliant Conduction Rail Assembly and Method Facilitating Cooling of an Electronics Structure", U.S. Appl. No. 12/570,215, filed Sep. 30, 2009.
Campbell et al., "Cooled Electronic Module with Pump-Enhanced, Dielectric Fluid Immersion-Cooling", U.S. Appl. No. 12/491,281, filed Jun. 25, 2009.
Campbell et al., "System and Method for Standby Mode Cooling of a Liquid-Cooled Electronics Rack", U.S. Appl. No. 12/567,954, filed Sep. 28, 2009.
Campbell et al., "Cooling System and Method Minimizing Power Consumption in Cooling Liquid-Cooled Electronics Racks", U.S. Appl. No. 12/556,066, filed Sep. 9, 2009.
Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.
Campbell et al., "Immersion-Cooling Apparatus and Method for an Electronic Subsystem of an Electronics Rack", U.S. Appl. No. 12/825,756, filed Jun. 29, 2010.
Campbell et al., "Interleaved, Immersion-Cooling Apparatus and Method for an Electronic Subsystem of an Electronics Rack", U.S. Appl. No. 12/825,761, filed Jun. 29, 2010.
Campbell et al., "Interleaved, Immersion-Cooling Apparatuses and Methods for Cooling Electronic Subsystems", U.S. Appl. No. 12/825,776, filed Jun. 29, 2010.
Campbell et al., "Liquid-Cooled Electronics Rack with Immersion-Cooled Electronic Subsystems", U.S. Appl. No. 12/825,781, filed Jun. 29, 2010.
Office Action for U.S. Appl. No. 12/256,628 (U.S. Patent Publication No. 2010/0103618 A1), dated Aug. 5, 2010.
Office Action for U.S. Appl. No. 12/256,605 (U.S. Patent Publication No. 2010/0103620 A1), dated Aug. 10, 2010.
Office Action for U.S. Appl. No. 12/256,623 (U.S. Patent Publication No. 2010/0101765 A1), dated Nov. 5, 2010.

* cited by examiner

APPARATUS AND METHOD FOR FACILITATING IMMERSION-COOLING OF AN ELECTRONIC SUBSYSTEM

TECHNICAL FIELD

The present invention relates to apparatuses and methods for facilitating cooling of an electronics system, such as a multi-blade center system, and more particularly, to apparatuses and methods for facilitating immersion-cooling of one or more electronic subsystems of an electronic system chassis.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air that is exhausted into the computer center.

In many server applications, processors along with their associated electronics (e.g., memory, disc drives, power supplies, etc.) are packaged in removable drawer or blade configurations disposed within a housing. Typically, the components are cooled by air moving in parallel air flow paths, usually front-to-back, impelled by one or more air-moving devices (e.g., fans or blowers). In some cases, it may be possible to handle increased power dissipation within a single drawer or blade chassis by providing greater air flow, through the use of a more powerful air-moving device, or by increasing the rotational speed (i.e., RPMs) of an existing air-moving device. However, this approach is becoming problematic at the system level.

The sensible heat load carried by air exiting the electronics rack is stressing the ability of room air-conditioning to effectively handle the load. This is especially true for large installations with "server farms" or large banks of computer racks close together. In such installations, liquid cooling of selected components is an attractive technology to manage the higher heat fluxes. The liquid coolant absorbs the heat dissipated by selected components/modules in an efficient manner. Typically, the absorbed heat is ultimately transferred from the liquid to an outside environment, whether air or liquid-cooled.

SUMMARY OF THE INVENTION

The shortcomings of the prior art are overcome and additional advantages are provided through the provision of an apparatus for facilitating cooling of an electronic subsystem. The apparatus includes a container sized to receive an electronic subsystem therein, and a hermetically sealed electrical connector disposed on a wall of the container. The hermetically sealed electrical connector is sized and configured to receive an electrical and network connector of the electronic subsystem when the electronic subsystem is operatively inserted into the container and to facilitate external electrical and network coupling thereto. The apparatus further includes a coolant inlet port and a coolant outlet port coupled to the apparatus for facilitating ingress and egress of coolant through the container, wherein when the electronic subsystem is operatively inserted into the container and coolant flows therethrough, the electronic subsystem is immersion-cooled by the coolant.

In another aspect, a cooled electronics rack is provided. The cooled electronics rack includes an electronics rack, at least one electronic subsystem, and an apparatus for facilitating cooling of the at least one electronic subsystem. The electronics rack at least partially surrounds and supports at least one electronic subsystem chassis configured to receive the at least one electronic subsystem. Each electronic subsystem includes multiple different types of components. Each apparatus includes a container sized to receive a respective electronic subsystem, and a hermetically sealed electrical connector disposed on a wall of the container. The hermetically sealed electrical connector is sized and configured to receive an electrical and network connector of the electronic subsystem when the electronic subsystem is operatively inserted into the container, and to facilitate electrical and network coupling between the electronic subsystem and the electronic subsystem chassis. The apparatus further includes a coolant inlet port and a coolant outlet port coupled to the container for facilitating ingress and egress of coolant through the container, wherein when the electronic subsystem is operatively inserted into the container and coolant flows therethrough, the electronic subsystem is immersion-cooled by the coolant.

In a further aspect, a method is provided for facilitating cooling of an electronic subsystem comprising multiple different types of components to be immersion-cooled. The method includes: providing a container sized to receive an electronic subsystem therein, the container comprising a hermetically sealed electrical connector disposed on a wall of the container, and a coolant inlet port and a coolant outlet port coupled to the container for facilitating ingress and egress of coolant through the container; operatively inserting the electronic subsystem into the container, wherein the hermetically sealed electrical connector is sized and configured to receive an electrical and network connector of the electronic subsystem when the electronic subsystem is operatively inserted into the container and facilitate external electrical and network coupling thereto; and coupling a coolant supply line to the coolant inlet port and coupling a coolant return line to the coolant outlet port to facilitate ingress and egress of coolant through the container, wherein when coolant flows through the container, the electronic subsystem is immersion-cooled by the coolant.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
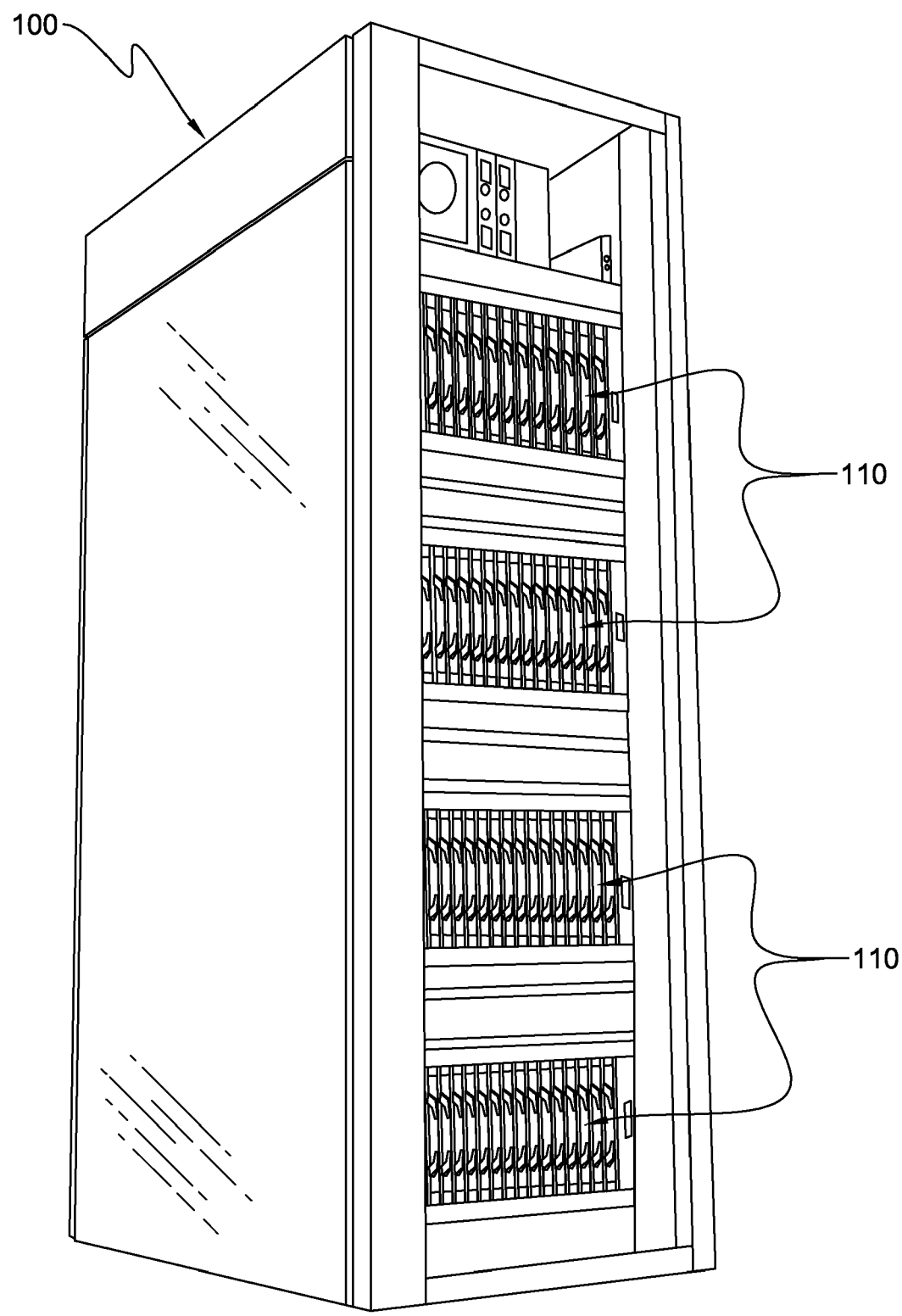
FIG. 1A depicts one embodiment of an electronics rack employing a stack of multiple-blade center systems to receive liquid coolant, in accordance with an aspect of the present invention.

As used herein, the term "electronics rack", includes any housing, frame, rack, compartment, blade server system, etc., having one or more heat generating components of a computer system, and may be, for example, a stand alone computer processor having high, mid or low end processing capability. In one embodiment, an electronics rack may comprise multiple electronic system chassis, each having multiple heat generating components or blades disposed therein requiring cooling. As one example, an electronic system chassis may be a multi-blade center system. The blades or subsystems of each multi-blade center system may be removable, and comprise multiple components to be liquid-cooled. In one example, one or more blades of a multi-blade center system are immersion-cooled blades. "Immersion-cooled electronic subsystem" or "immersion-cooled blade" refers to any blade, book, node, etc., having multiple different types of components thereof cooled by common immersion within coolant flowing around or across the subsystem. One example of a liquid-cooled electronics rack employing immersion-cooled electronic subsystems is described in co-filed, commonly assigned U.S. patent application entitled "Liquid Cooling Apparatus and Method for Cooling Blades of an Electronic System Chassis", Ser. No. 12/256,623, filed Oct. 23, 2008, published Apr. 29, 2010, as U.S. Patent Publication No. 2010/0101765A1, the entirety of which is hereby incorporated herein by reference. Multiple components of an immersion-cooled electronic subsystem may be directly immersion-cooled by the coolant or indirectly immersion-cooled. Indirect immersion cooling refers to the existence of a thermal cap, thermal spreader, passivation layer, or other surface interposed between a surface of the component and the coolant within which the component is immersed.

As a further example, an electronic subsystem may comprise a printed circuit board with a plurality of different types of discrete devices operatively connected thereto. A blade server for a multi-blade center system is one detailed example of an electronic subsystem to be immersion-cooled.

As used herein, "heat exchanger" refers to any heat exchange assembly through which a first coolant and a second coolant can circulate. In the embodiments described herein, the first coolant is a liquid coolant, and the second coolant is a two-phase coolant which undergoes condensation within the heat exchanger. The heat exchanger comprises a first coolant path and a plurality of isolated second coolant paths, wherein a plurality of thermally conductive fins extend into the first coolant path and a plurality of thermally conductive fins extend into each of the plurality of second coolant paths. Otherwise, size, configuration and construction of the heat exchanger can vary without departing from the scope of the invention disclosed herein.

One example of a liquid coolant flowing through the first coolant path is water, and one example of a two-phase coolant flowing through the plurality of second coolant paths is a two-phase dielectric coolant. For example, the two-phase dielectric coolant may comprise a fluorocarbon or segregated hydrofluoroether liquid (e.g., FC-86, FC-87, FC-72, HFE-7000, HFE-7100, or HFE-7200, each of which is available from 3M Corporation, St. Paul, Minn., USA). Fluorocarbon liquid typically boils at 30° C.-80° C. at atmospheric pressure, while water boils at 100° C. Those skilled in the art should note, however, that the concepts disclosed herein are readily adapted to other types of first coolant and second coolant. For example, one or more of the coolants may comprise a brine, a liquid metal, or similar coolant, or a refrigerant, while still maintaining various advantages and unique features of the present invention.

Reference is made below to the drawings, which are not drawn to scale and are simplified for ease of understanding, and wherein the same reference numbers used throughout different figures designate the same or similar components.

FIG. 1A depicts one embodiment of an electronics rack 100 comprising a stack of electronic system chassis or multi-blade center systems 110, as well as supporting power supplies, networking equipment, etc.

Figure 1B:
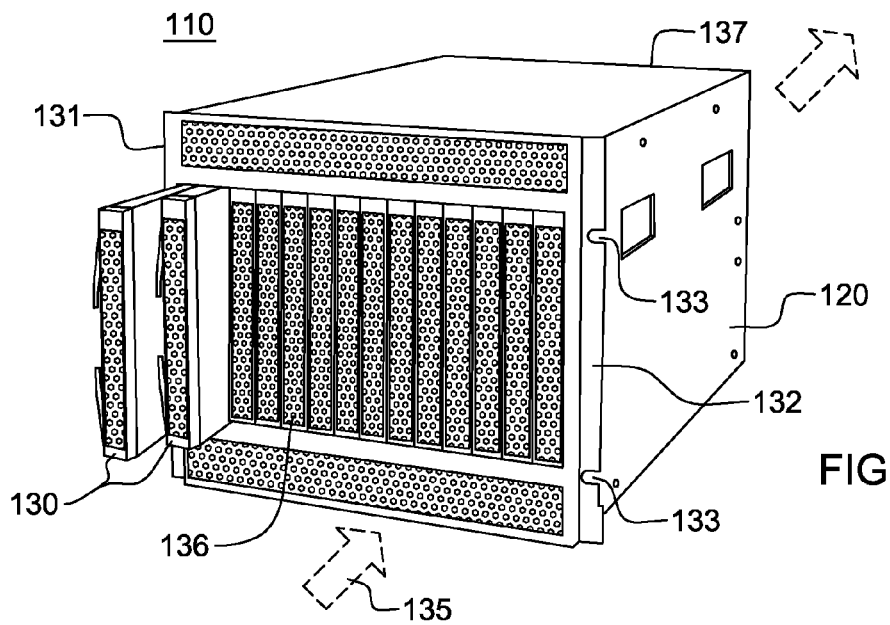
FIG. 1B is an isometric view of one embodiment of one multi-blade center system of the electronics rack of FIG. 1A.

FIG. 1B illustrates one embodiment of multi-blade center system 110, one example of which is marketed by International Business Machines Corporation, of Armonk, N.Y. By way of specific example, multi-blade center system 110 may comprise a stand alone server system which incorporates scalable computing functionality up to, for example, fourteen high performance servers (or blades).

As shown in FIG. 1B, multi-blade center system 110 includes a system chassis 120 and multiple removable blades 130. As one example, each removable blade 130 is an electronics subsystem, such as a server of a multi-server electronics system. A first flange 131 and second flange 132 with openings 133 are also illustrated. Typically, flanges 131, 132 are used to secure the multi-blade center system within an electronics rack, such as depicted in FIG. 1A. Airflow 135 is conventionally provided through an air inlet side 136 of multi-blade center system 110 to an air outlet side 137, and is typically established, for example, by two or more air-moving devices (not shown) disposed at the back portion of the system housing. Electrical and networking infrastructure is also located near the back of system chassis 120.

Figure 1C:
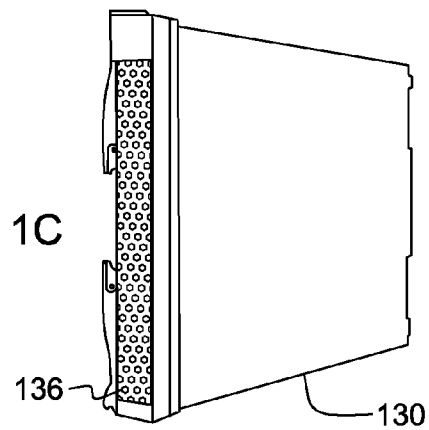
FIG. 1C is an isometric view of one embodiment of an individual removable blade of a multi-blade center system of FIG. 1B.
Figure 1D:
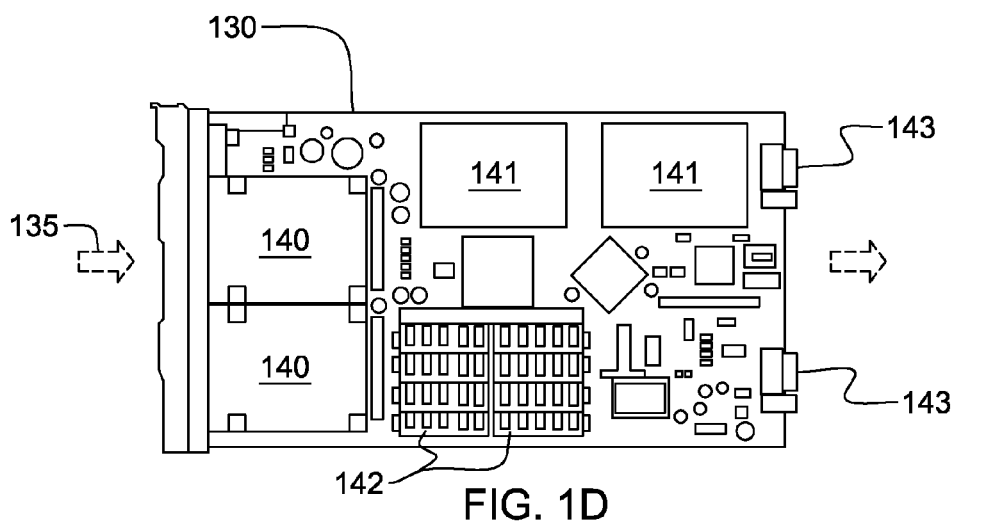
FIG. 1D is a side elevational view of one embodiment of the removable blade of FIG. 1C.

FIGS. 1C & 1D depict one embodiment of a removable blade 130 of the electronic system chassis. As illustrated in FIG. 1D, removable blade 130 includes, for example, multiple processors above which conventionally reside respective air-cooled heat sinks 140. In this example, each removable blade is a complete computer system, or subsystem, and includes, for example, Direct Access Storage Device (DASD) 141 and Dual In-Line Memory Modules (DIMMs) 142. Electrical connectors 143 are provided for electrically connecting blade 130 to the respective electronic system chassis 120 (FIG. 1B). Corresponding electrical connectors are disposed within the electronic system chassis near the back thereof for making electrical connection to connectors 143 when the blade is inserted into the chassis in operational position.

By way of specific example, a typical blade center chassis today is 9 U tall (where 1 U equals 1.75 inches or 44.45 mm) and houses 14 field-replaceable blades, each containing two central processing units (CPUs). A standard electronics rack that is 42 U tall can thus accommodate four such blade center chassis (each 9 U tall), for a total of 56 blades and 112 CPU modules. International Business Machines Corporation markets three versions of a blade center chassis, namely, the BC, BCH and BC-Telco versions. FIGS. 1A-1D illustrate one example of a BCH chassis marketed by International Business Machines Corporation, however, the concepts presented herein are readily applicable to any blade center chassis configuration, as well as to other electronic system housing variants. Further, the liquid cooling apparatus described herein is readily adaptable to use with any housing version with multiple components to be immersion-cooled.

Advantageously, liquid cooling of a multi-blade center system, or an electronics rack such as depicted in FIG. 1A, provides increased cooling at the module and rack level, and enables higher performance systems than currently feasible using air-cooling. Further, a liquid cooling apparatus, such as described below, improves energy efficiency by eliminating or reducing requirements on one or more data center air-conditioning units; that is, by rejecting heat to liquid coolant, which in one example, is subsequently rejected to the ambient environment outside of the data center. With a liquid cooling approach such as described herein, the conventional air-moving devices within the multi-blade center systems and the electronics rack are eliminated, thereby reducing acoustic noise within the data center. Additionally, a reduced form factor of the processor's thermal solution is provided, thus allowing more functionality to be packaged within a single subsystem or blade. This added functionality could be memory, hard drives, or other devices, which would allow for a more competitive offering within the market place.

Co-pending U.S. patent application Ser. No. 12/168,259, filed Jul. 7, 2008, entitled "Liquid Cooling Apparatus and Method for Facilitating Cooling of an Electronic System", which is hereby incorporated herein by reference, discloses forced liquid cooling of selected components of one or more electronic system chassis. Disclosed hereinbelow is a liquid cooling apparatus which achieves 100% liquid cooling of, for example, the blades of a multi-blade center system, whether as a stand alone system, or stacked within an electronics rack with other multi-blade center systems.

Figure 2:
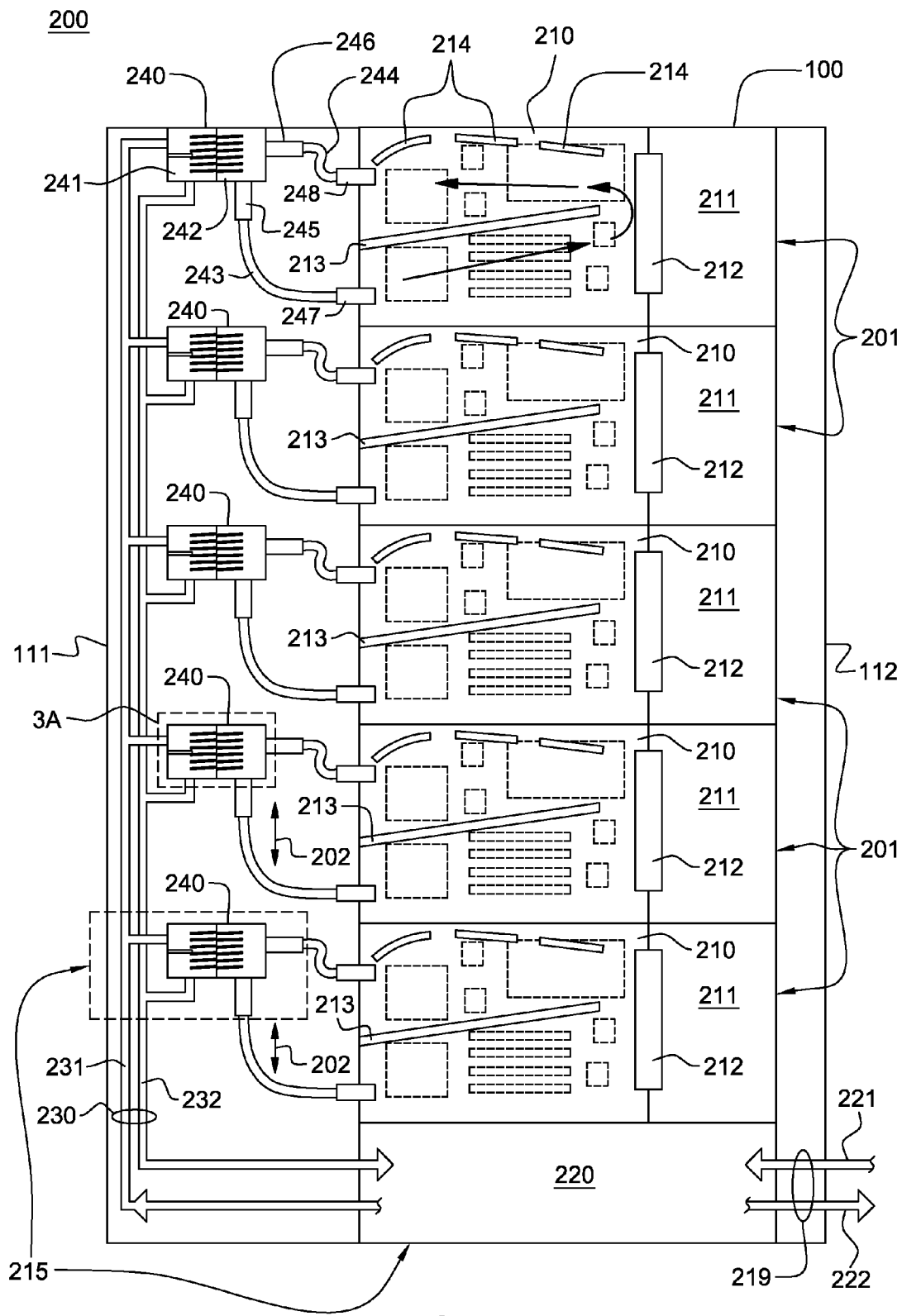
FIG. 2 is a schematic of one embodiment of a cooled electronics rack, comprising (in the illustrated embodiment) a stack of multi-blade center systems and a liquid cooling apparatus, in accordance with an aspect of the present invention.

FIG. 2 is a schematic of one embodiment of a cooled electronics rack, generally denoted 200, in accordance with an aspect of the present invention. Cooled electronics rack 200 includes an electronics rack 100 having a plurality of multi-blade center systems 201 stacked within the rack. In this example, five multi-blade center systems 201 are illustrated, with each system being an example of an electronic system chassis. As illustrated in FIG. 2, each multi-blade center system 201 includes a back plane 212, into which respective removable blades 210 are electrically inserted, and a back space 211 which conventionally accommodates one or more air-moving devices (not shown) to cause airflow to flow from a front side 111 to a back side 112 of electronics rack 100 through the multi-blade center system 201.

One embodiment of a liquid cooling apparatus, generally denoted 215, is illustrated in FIG. 2. In this embodiment, a liquid cooling unit 220 is disposed in a lower portion of electronics rack 100. Liquid cooling unit 220 includes, for example, a liquid-to-liquid heat exchanger (not shown) for extracting heat from coolant flowing through a first coolant loop 230 of liquid cooling apparatus 215 and dissipating heat within a facility coolant loop 219 comprising a facility coolant supply line 221 and facility coolant return line 222. In one example, facility coolant supply line 221 and facility coolant return line 222 couple liquid cooling unit 220 to a data center facility coolant supply and return (not shown). Liquid cooling unit 220 further includes an appropriately sized reservoir, pump, and optional filter, for moving liquid coolant through first coolant loop 230. In one embodiment, first coolant loop 230 includes a rack-level inlet manifold 231 and a rack-level outlet manifold 232, which are coupled to liquid cooling unit 220 via, for example, flexible hoses and respective quick connect couplings. The flexible hoses allow the rack-level manifolds to be mounted within, for example, a door of the electronics rack hingedly mounted to the air inlet side of the electronics rack in a manner similar to that described in co-pending, commonly assigned U.S. patent application Ser. No. 11/763,678, filed Jun. 15, 2007, entitled "Liquid-Based Cooling Apparatus for an Electronics Rack", the entirety of which is hereby incorporated herein by reference. In one example, rack-level inlet manifold 231 and rack-level outlet manifold 232 each comprise an elongated, rigid tube vertically mounted to electronics rack 100.

In the embodiment illustrated, the rack-level coolant manifold assembly, comprising rack-level inlet manifold 231 and rack-level outlet manifold 232 is in fluid communication with multiple movable chassis-level manifold subassemblies 240. Various examples of movable chassis-level manifold subassemblies mounted to an electronics rack are described in the above-incorporated, co-pending U.S. patent application Ser. No. 12/168,259, entitled "Liquid Cooling Apparatus and Method for Facilitating Cooling of an Electronics System". As illustrated in FIG. 2, each movable chassis-level manifold assembly is coupled to the electronics rack to reciprocate vertically (as indicated by arrows 202) adjacent to an associated electronic system chassis to facilitate the removal of individual blades, without impacting cooling of adjacent blades. Respective quick connect couplings may be employed to couple the rack-level inlet manifold and rack-level outlet manifold to each movable chassis-level manifold assembly 240, using for example appropriately sized, flexible rack-level tubing. The quick connect couplings may be any one of various types of commercially available couplings, such as those available from Colder Products Company, of St. Paul, Minn., USA, or Parker Hannifin, of Cleveland, Ohio, USA.

Each movable chassis-level manifold assembly 240 includes a first chamber 241 and a plurality of second chambers 242 disposed, in this example, within a common structure, but isolated to prevent direct flow of coolant therebetween. As explained further below, the first chamber and the plurality of second chambers are isolated by a heat exchanger which facilitates transfer of heat from coolant flowing through a plurality of second coolant paths passing through the plurality of second chambers to coolant flowing through a first coolant path passing through the first chamber. Heat transferred to coolant passing through the first coolant path of each chassis-level manifold assembly is transferred via the rack-level outlet manifold 232 and liquid cooling unit 220 to facility coolant loop 219. In one example, coolant passing through first coolant loop 230, and hence, coolant passing through the first coolant paths within the movable chassis-level manifold assemblies, is water. In the example illustrated, the vertically oriented rack-level inlet and outlet manifolds each have five ports, which connect to five horizontally oriented, movable chassis-level manifold assemblies 240. The chassis-level manifold assemblies serve as a heat rejection component for the heat load removed from the individual blades 210 of the respective multi-blade center systems 201.

Each second chamber of the plurality of second chambers of each chassis-level manifold assembly 240 has an outlet coupled via flexible tubing 243 to a coolant inlet of a respective immersion-cooled blade 210. In one embodiment, each flexible tubing 243 couples to a respective second chamber of the chassis-level manifold assembly 240 via an appropriate hose barb fitting 245, and couples to the immersion-cooled blade 210 via a quick connect coupling 247. Further, flexible tubing 244 couples an inlet of each second chamber of the plurality of second chambers of each chassis-level manifold assembly 240 to a coolant outlet of the respective immersion-cooled blade 210. At the outlet, a quick connect coupling 248 may again be employed to facilitate connection or disconnection of the corresponding immersion-cooled blade, while at the other end, flexible tubing 244 couples to chassis-level manifold assembly 240 via an appropriate hose barb fitting 246. Flexible tubes 243, 244 are sized and provided with sufficient flexibility to allow the associated movable chassis-level manifold assembly 240 to reciprocate within a designed extent of travel, as illustrated by arrows 202.

As noted, in one example, a two-phase dielectric coolant is employed within immersion-cooled blade 210 and the second chambers of the respective chassis-level manifold assemblies 240. In operation, upper flexible tubing 244 transports vaporized coolant from the immersion-cooled blade 210 to the corresponding second chamber of the chassis-level manifold assembly. This second chamber functions as a condenser, with the lower flexible tubing 243 transporting condensed liquid coolant from the second chamber to the immersion-cooled blade 210 for continued cooling of the immersion-cooled blade. Electronic components within the blade may be exposed either directly or indirectly to the dielectric coolant, and heat transfer takes place via, for example, boiling at one or more surfaces of the heat-producing components. The liquid coolant, and resultant vapor, are directed via one or more baffles 213 to an upper portion of the blade 210, where the vapor rises to the top portion of the blade, and is directed via one or more vapor deflectors 214 back into the second chamber for condensing. Flow of vapor back to the second chamber is facilitated by the liquid-vapor pressure differential between the upper portion of the blade and the corresponding second chamber functioning as the condenser region. As discussed further below, both the first chamber and the plurality of second chambers of the chassis-level manifold assembly have thermally conductive fin structures extending therein from the heat exchanger to enhance heat transfer. These fin structures may comprise pin fin type thermally conductive elements, or plate type thermally conductive elements. The coolant flowing through the first chamber of each chassis-level manifold assembly yields a temperature at the condenser fins in the respective second chambers of the manifold assembly that is well below the boiling point of the dielectric coolant employed in the immersion-cooled blade. As a result, the vapor condenses over the surfaces of these fins. The condensed liquid may be close in temperature to the vapor, or it could be sub-cooled to a much lower temperature, based on operating conditions on the first coolant loop side of the manifold assembly's heat exchanger.

FIGS. 3A-7B depict various embodiments of an apparatus for facilitating immersion-cooling of an electronic subsystem, in accordance with an aspect of the present invention.

Figure 3B:
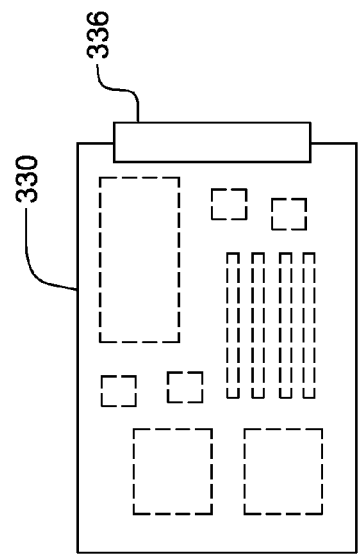
FIG. 3B is an elevational view of one embodiment of an electronic subsystem to be inserted into the hermetically sealable container of FIG. 3A for immersion cooling thereof, in accordance with an aspect of the present invention.
Figure 3A:
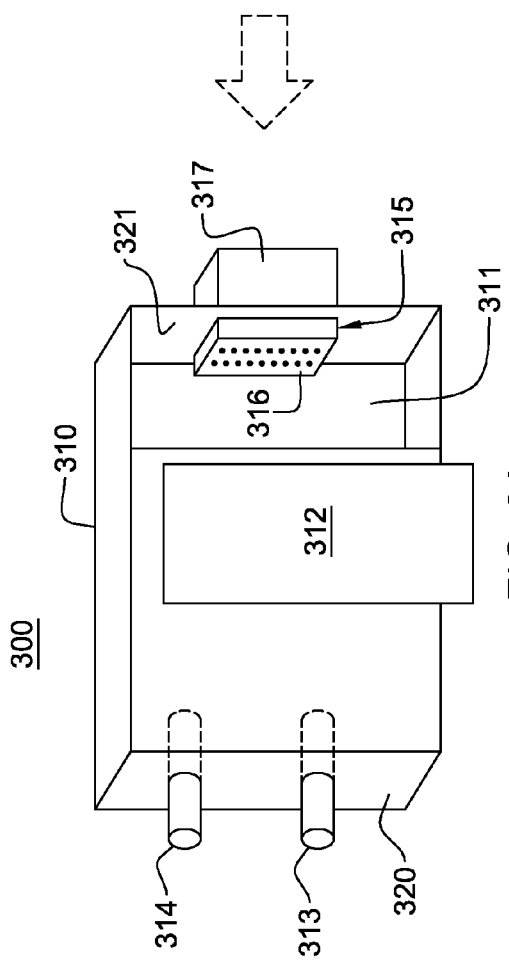
FIG. 3A is an isometric view of one embodiment of a hermetically sealable container configured to receive an electronic subsystem for immersion cooling thereof, in accordance with an aspect of the present invention.
Figure 3C:
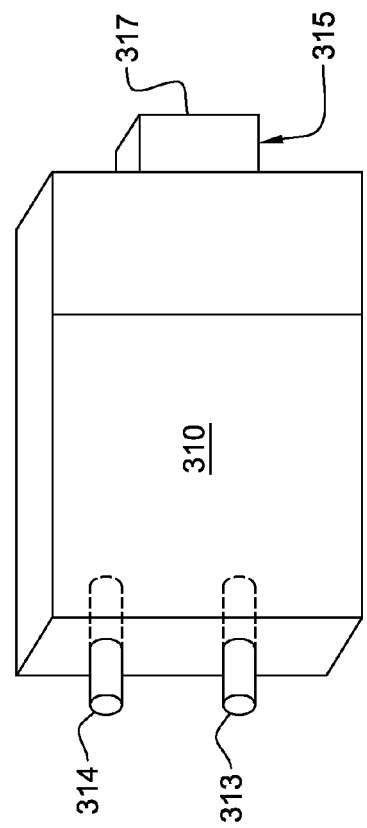
FIG. 3C is an isometric view of the hermetically sealed container of FIG. 3A, with the electronic subsystem of FIG. 3B operatively inserted therein for immersion cooling thereof, in accordance with an aspect of the present invention.

Refer first to FIGS. 3A-3C, which illustrate one embodiment of an apparatus 300 for facilitating cooling of an electronic subsystem. Apparatus 300 includes a hermetically sealable container 310, which in one embodiment is a polymeric container, designed to encapsulate an electronic subsystem 330 (FIG. 3B). Hermetically sealable container 310 includes an opening 311 to allow insertion (or removal) of the electronic subsystem into (or from) the container. A cover 312 is sized and configured to seal and enclose the electronic subsystem within the container once operatively positioned therein. The cover 312 may comprise, for example, a hinged flap designed to be hermetically sealed to the walls of the container once the electronic subsystem is functionally positioned within the container. In an alternate embodiment, opening 311 could be differently sized or configured, depending on the electronic subsystem to be inserted into the container. Hermetic sealing of cover 312 to container 310 could be achieved, for example, by epoxying the cover to the container once the electronic subsystem is operatively positioned therein.

In FIGS. 3A & 3C, container 310 is depicted (by way of example) as a rectangular-shaped housing. A first container wall 320, for example, the front wall of container 310, includes a coolant inlet port 313 and a coolant outlet port 314 extending therethrough. The coolant inlet and outlet ports 313, 314, which are hermetically sealed to first container wall 320, respectively allow ingress and egress of coolant through the container. Container 310 also includes a hermetically sealed electrical connector 315 in a second container wall 321, for example, the back wall of the container. Hermetically sealed electrical connector 315 includes an internal electrical and network connection interface 316 sized and configured to mate with an electrical and network connector 336 (FIG. 3B) disposed at one end of the electronic subsystem 330 to be immersion-cooled within the container 310. An external electrical and network connector 317 of hermetically sealed electrical connector 315 facilitates external electrical and network coupling of electronic subsystem 330 when the electronic subsystem is operatively positioned within container 310.

As illustrated in FIG. 3A, coolant inlet port 313 and coolant outlet port 314 are, in one embodiment, cylindrical-shaped, and may include hose barb fittings or NPT threaded internal or external portions, to facilitate coupling thereof to a fluid hose or tube via, for example, hose clamp attachments or quick connect couplings. In one implementation, these inlet and outlet ports are inserted and then hermetically sealed into recesses within first container wall 320. Alternatively, the ports could be formed integral with the container body. The interiors of the coolant inlet and outlet ports may comprise cylindrical tubes.

On the opposing, second container wall 321 the internal electrical and network connection interface 316 and external electrical and network connector 317 of hermetically sealed electrical connector 315 are disposed to facilitate providing the electrical and network communication functionality for the electronic subsystem. These fittings are attached to container 310 in a hermetically sealed manner. The internal portion of the hermetically sealed electrical connector 315 is configured to couple to the complementary electrical and network connector 336 of electronic subsystem 330. Once electronic subsystem 330 is operatively positioned within container 310, cover 312 is hermetically sealed to the container, resulting in the container structure illustrated in FIG. 3C, wherein the coolant inlet port 313 and coolant outlet port 314 extend from one wall of the container, and the external electrical and network connector portion 317 of the hermetically sealed electrical connector 315 extends from an opposing wall of the container.

Figure 4:
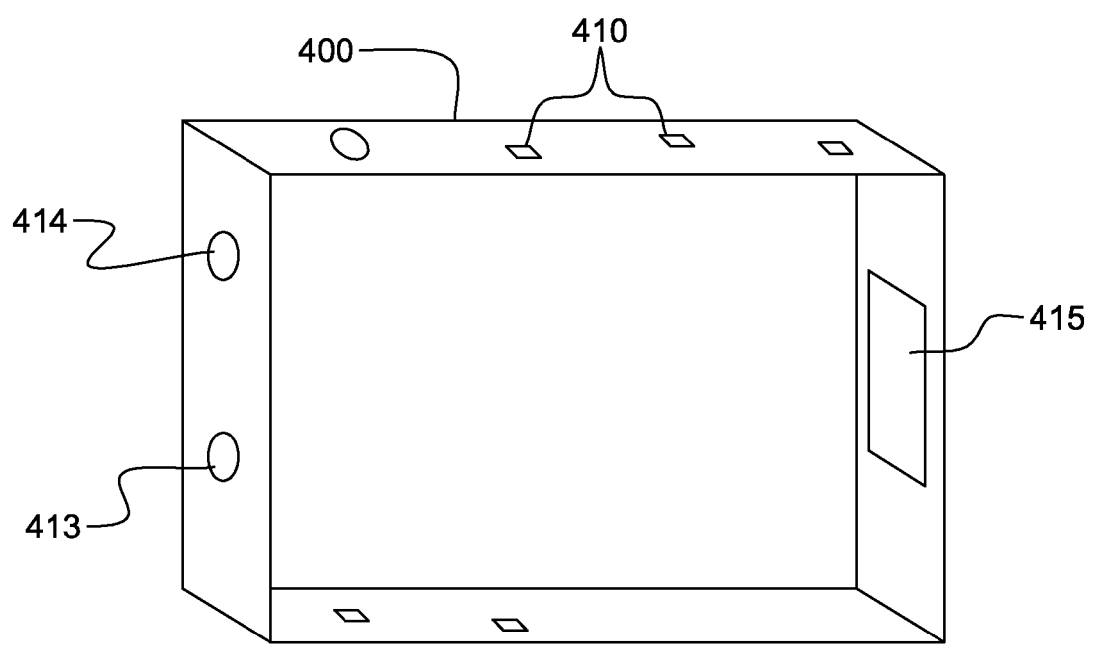
FIG. 4 is an isometric view of one embodiment of an outer support shell employable with a container, such as depicted in FIGS. 3A & 3C, in accordance with an aspect of the present invention.

FIG. 4 illustrates one embodiment of an outer shell 400, in accordance with an aspect of the present invention. This outer shell provides, in one embodiment, structural rigidity to the apparatus, and is designed to accommodate the container of FIGS. 3A & 3C therein. In one embodiment, outer shell 400 is fabricated as a sheet metal structure and similarly sized and configured as existing blade server shells for multi-blade center systems. Outer shell 400 includes one or more mechanical features 410 on outer surfaces thereof which allow engagement of the apparatus with an electronic subsystem chassis to, for example, facilitate insertion of the apparatus into a docking slot in an electronic subsystem chassis. Port openings 413 & 414 are provided in a front wall of outer shell 400. These port openings are sized and positioned to align with the coolant inlet and outlet ports of the container when the container is positioned within the outer shell. A rectangular slot or opening 415 is provided in the back wall of outer shell 400. This rectangular slot or opening is sized and positioned to align with the hermetically sealed electrical connector of the container. For visual clarification, the outer shell is shown with one side plate or panel having been removed.

Figure 5A:
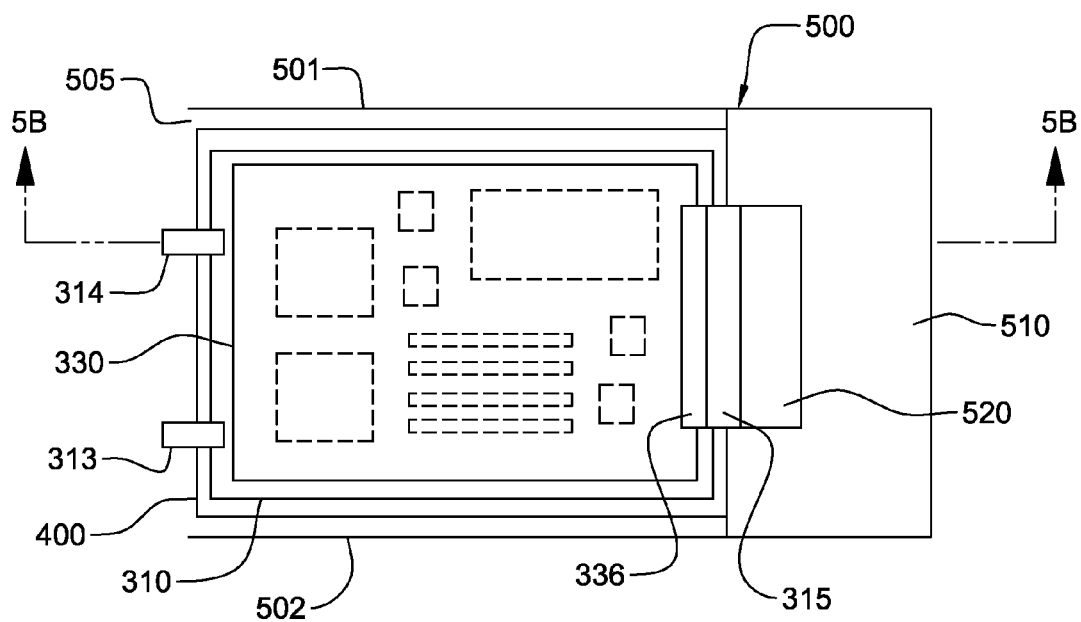
FIG. 5A is a cross-sectional elevational view of one embodiment of a multi-blade center system, taken along line 5A-5A of FIG. 5B, and illustrating an apparatus containing therein in operative position an immersion-cooled electronic blade, in accordance with an aspect of the present invention.
Figure 5B:
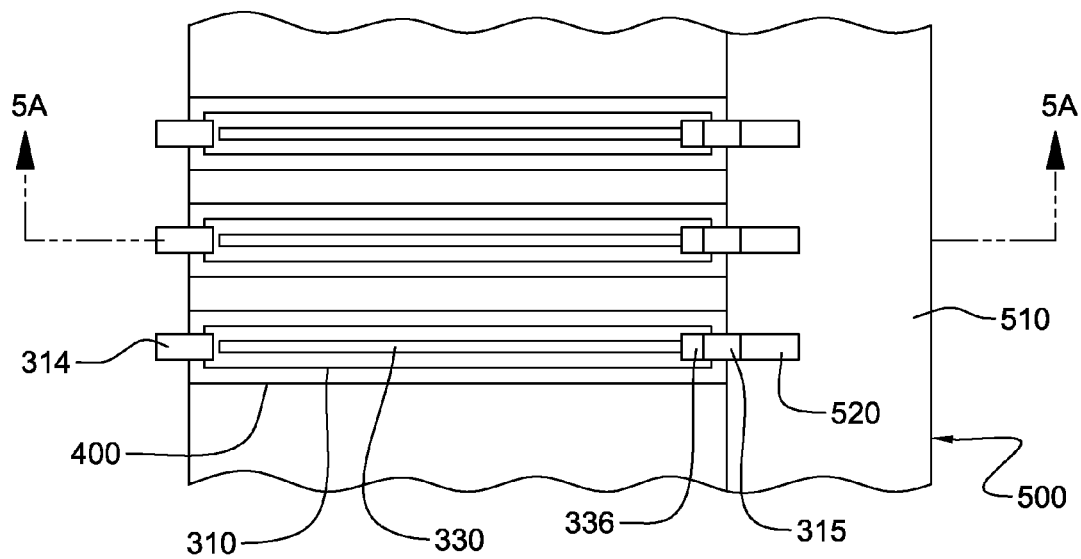
FIG. 5B is a partial plan view of the multi-blade center system of FIG. 5A, taken along line 5B-5B thereof, in accordance with an aspect of the present invention.

FIGS. 5A & 5B illustrate elevational and plan cross-sectional views, respectively, of an immersion-cooled electronic subsystem disposed within an apparatus operatively positioned within an electronic subsystem chassis 500, in accordance with an aspect of the present invention. The immersion-cooled electronic subsystem 330 is fully encapsulated by container 310, which in turn is housed within outer shell 400. Outer shell 400 is sized for positioning within a docking slot or opening 505 between an upper wall 501 and a lower wall 502 of electronic subsystem chassis 500. As illustrated, a rear section 510 of electronic subsystem chassis 500 includes an electrical and network back plane 520, which is configured to receive the external electrical and network connector of the hermetically sealed electrical connector 315 of container 310. This electrical and network back plane 520 provides the electrical and network communication facility to the electronic subsystem 330 when electrical and network connector 336 of the electronic subsystem is operatively inserted into hermetically sealed electrical connector 315, and hermetically sealed electrical connector 315 is operatively inserted into electrical and network back plane 520. When operatively docked within the electronic subsystem chassis, the coolant inlet port 313 and coolant outlet port 314 extend from the front wall of the apparatus for coupling to, for example, a liquid coolant distribution apparatus such as depicted in FIG. 2, and described above.

Figure 6A:
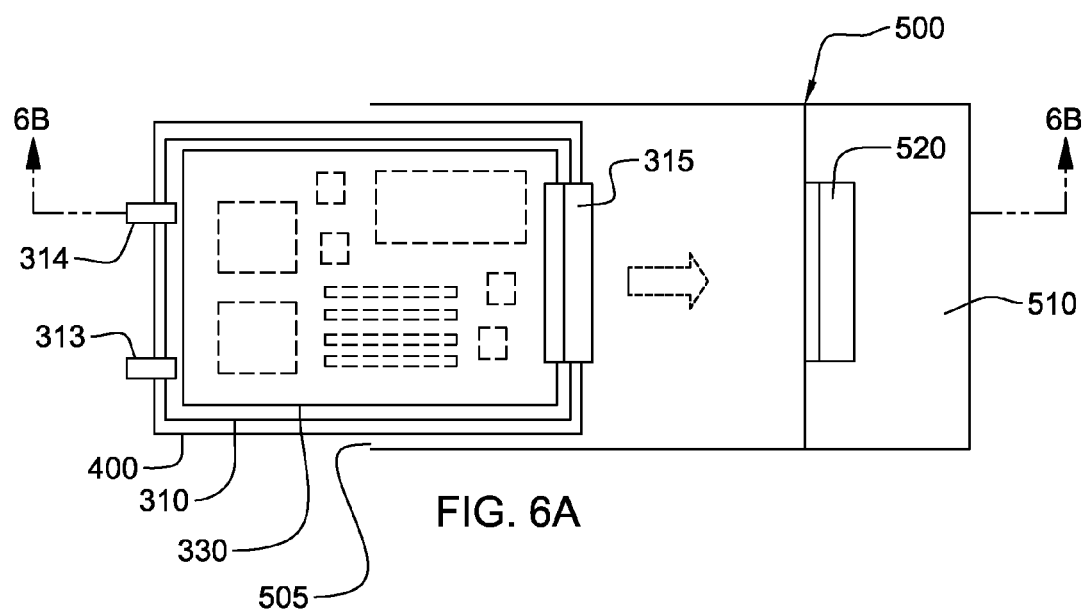
FIG. 6A depicts the multi-blade center system embodiment of FIGS. 5A & 5B in cross-sectional elevational view, taken along line 6A-6A of FIG. 6B, and illustrating insertion of an apparatus, with an electronic subsystem operatively disposed therein, into the multi-blade center system, in accordance with an aspect of the present invention.
Figure 6B:
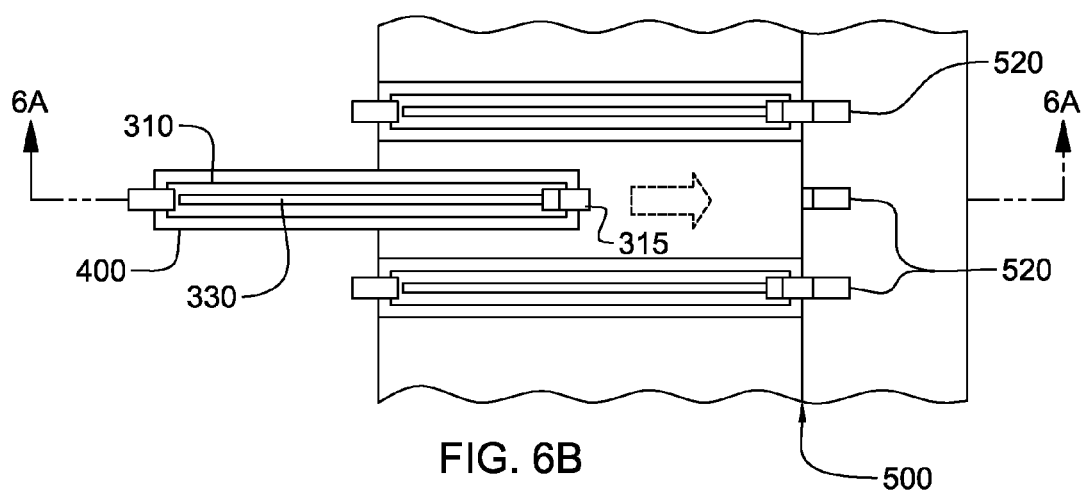
FIG. 6B is a partial plan view of the multi-blade center system of FIG. 6A, taken along line 6B-6B thereof, in accordance with an aspect of the present invention.

FIGS. 6A & 6B depict the apparatus and electronic subsystem chassis of FIGS. 5A & 5B, and illustrate insertion of the apparatus (comprising outer shell 400, container 310 and electronic subsystem 330 operatively positioned therein) into a corresponding docking slot or opening 505 within electronic subsystem chassis 500. As illustrated, hermetically sealed electrical connector 315 is sized to mate with electrical and network back plane 520 disposed within the rear section 510 of electronic subsystem chassis 500. Each docking slot or opening within the electronic subsystem chassis has associated therewith an electrical and network back plane 520 for operatively receiving a respective apparatus comprising an immersion-cooled electronic subsystem.

Figure 7A:
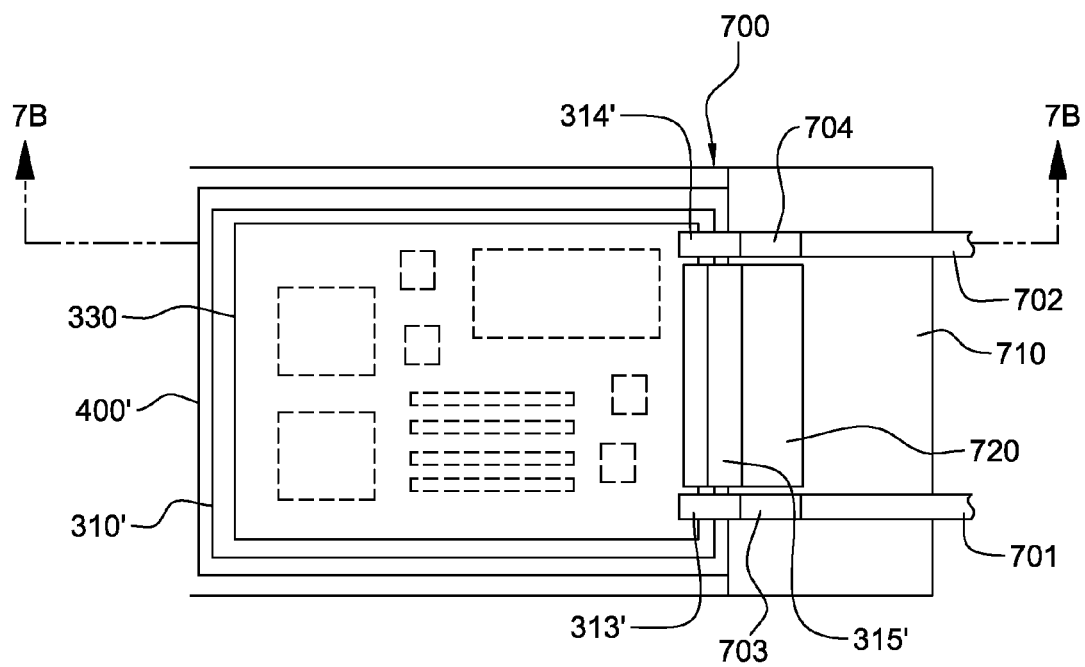
FIG. 7A is a cross-sectional elevational view of an alternate embodiment of a multi-blade center system, taken along line 7A-7A of FIG. 7B, and illustrating another embodiment of an apparatus, with an immersion-cooled electronic subsystem disposed therein, in accordance with an aspect of the present invention.
Figure 7B:
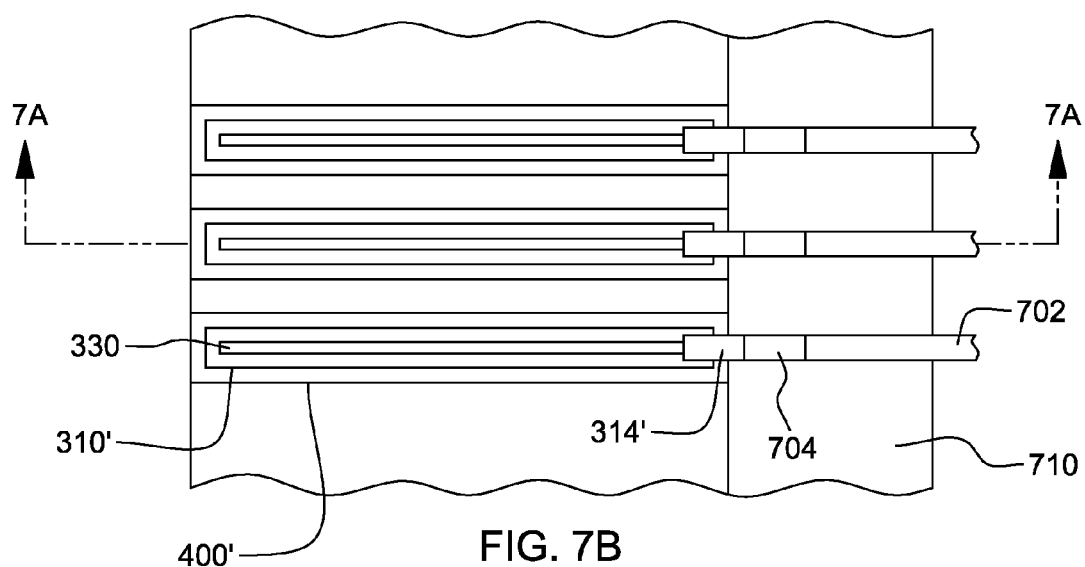
FIG. 7B is a partial plan view of the multi-blade center system embodiment of FIG. 7A, taken along line 7B-7B thereof, in accordance with an aspect of the present invention.

FIGS. 7A & 7B illustrate an alternate embodiment of an apparatus and electronic subsystem chassis, in accordance with an aspect of the present invention. In this embodiment, electronic subsystem chassis 700 includes a coolant supply line 701 and a coolant return line 702 extending through a rear section 710 of the electronic subsystem chassis. Both the coolant ports 313', 314' and the electrical and network connector are located in a common wall of the container, that is, the back wall of the container. Blind mate connectors 703 are interposed between the coolant inlet port 313' and the coolant supply line 701, and blind mate connectors 704 are interposed between coolant outlet port 314' and coolant return line 702. Coolant supply line 701 and coolant return line 702 may comprise either flexible or rigid tubing, and be sized and coupled to respectively facilitate the supply and return of coolant (such as the two-phase coolant described initially herein) for immersion-cooling of the electronic subsystem. As illustrated, the apparatus includes outer shell 400', hermetically sealed container 310' and the coolant-immersed electronic subsystem 330 disposed within the hermetically sealed container. Electrical and network connections are via the hermetically sealed electrical connector 315' of the apparatus, which is shown operatively coupled to an electrical and network back plane 720 in the rear section 710 of electronic subsystem chassis 700.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronic subsystem board, the apparatus comprising:
 a container comprising a front wall, a back wall, and a side wall interconnecting the front wall and the back wall, the container being sized to receive through a sealable opening in the side wall thereof an electronic subsystem board, the container and the electronic subsystem board being configured for the electronic subsystem board to operatively dock within the container, the electronic subsystem board comprising multiple different types of components, wherein the container is sized and configured to operatively dock in a vertical orientation within an electronics rack;
 a hermetically sealed electrical connector disposed on the back wall of the container and configured to dock to an electrical backplane of the electronics rack when the container is operatively docked within the electronics rack, the hermetically sealed electrical connector being sized and configured to receive an electrical and network connector of the electronic subsystem board when the electronic subsystem board is operatively docked within the container and facilitate external electrical and network coupling thereto via the electrical backplane of the electronics rack; and a coolant inlet port and a coolant outlet port coupled to the container for facilitating ingress and egress of coolant through the container, the coolant inlet port being disposed in a lower portion of the container and the coolant outlet port being disposed in an upper portion of the container, wherein when the electronic subsystem board is operatively docked within the container and the container is operatively docked within the electronics rack, coolant flows through the container and the electronic subsystem board is immersion-cooled by the coolant, and wherein the sealable opening in the side wall of the container allows the hermetically sealed electrical connector on the back wall of the container and the coolant inlet port and the coolant outlet port secured to the container to remain structurally stationary with docking or undocking of the electronic subsystem board in the container.

2. The apparatus of claim 1, wherein the container is sized to receive and operatively dock a single electronic subsystem board therein.

3. The apparatus of claim 1, further comprising an outer shell configured to surround the container and be disposed within the electronics rack when the container is operatively docked therein, the outer shell including an opening sized to accommodate the hermetically sealed electrical connector disposed on the back wall of the container, and first and second coolant port openings sized and positioned to pass therethrough the coolant inlet port and coolant outlet port of the container, wherein the outer shell provides added structural support for the container.

4. The apparatus of claim 1, wherein the electronics rack comprises a blade center chassis of a multi-blade center system, and wherein the electronics subsystem board is an immersion-cooled blade.

5. The apparatus of claim 1, wherein the coolant inlet port and coolant outlet port are disposed in the front wall of the container, wherein the front wall and the back wall are opposite walls of the container.

6. The apparatus of claim 1, wherein the coolant inlet port and coolant outlet port are disposed in the back wall of the container with the hermetically sealed electrical connector, and comprise blind-mate connect couplings which facilitate coupling of the container to a coolant supply line and a coolant return line, respectively.

7. The apparatus of claim 1, wherein the container comprises a hermetically sealable container, and wherein the apparatus further comprises an outer support shell configured to surround the hermetically sealable container and be disposed within the electronics rack when the container is operatively docked therein.

8. The apparatus of claim 1, wherein the coolant inlet port and the coolant outlet port are each formed integral with the container.

9. A cooled electronics rack comprising:
an electronics rack at least partially surrounding and supporting at least one electronic system chassis;
at least one electronic subsystem board, each electronic subsystem board comprising multiple different types of components; and
at least one apparatus for facilitating cooling of the at least one electronic subsystem board, each apparatus of the at least one apparatus comprising:
a container comprising a front wall, a back wall, and a side wall interconnecting the front wall and the back wall, the container being sized to receive through a sealable opening in the side wall thereof a respective electronic subsystem board of the at least one electronic subsystem board, the container and the electronic subsystem board being configured for the electronic subsystem board to operatively dock within the container, wherein the container is sized and configured to operatively dock in a vertical orientation within an electronics rack;
a hermetically sealed electrical connector disposed on the back wall of the container and configured to dock to an electrical backplane of the electronics rack when the container is operatively docked within the electronics rack, the hermetically sealed electrical connector being sized and configured to receive an electrical and network connector of the respective electronic subsystem board when the electronic subsystem board is operatively docked within the container and facilitate electrical and network coupling between the respective electronic subsystem board and the at least one electronic system chassis via the electrical backplane thereof; and
a coolant inlet port and a coolant outlet port coupled to the container for facilitating ingress and egress of coolant through the container, the coolant inlet port being disposed in a lower portion of the container and the coolant outlet port being disposed in an upper portion of the container, wherein when the respective electronic subsystem board is operatively docked within the container and the container is operatively docked within a respective electronic system chassis of the electronics rack, coolant flows through the container and the multiple different types of components of the electronic subsystem board are immersion-cooled by the coolant, and wherein the sealable opening in the side wall of the container allows the hermetically sealed electrical connector on the back wall of the container and the coolant inlet port and the coolant outlet port secured to the container to remain structurally stationary with docking or undocking of the electronic subsystem board in the container.

10. The cooled electronics rack of claim 9, wherein each container is sized to receive and operatively dock a single electronic subsystem board therein.

11. The cooled electronics rack of claim 9, wherein each apparatus of the at least one apparatus further comprises an outer shell configured to surround the container and be disposed within a respective electronics system chassis when the container is operatively docked therein, the outer shell including an opening sized to accommodate the hermetically sealed electrical connector disposed on the back wall of the container, and first and second coolant port openings sized and positioned to pass therethrough the coolant inlet port and the coolant outlet port of the container, respectively, wherein the outer shell provides added structural support for the container, and is configured to facilitate insertion of the apparatus into the respective electronic system chassis of the at least one electronic system chassis supported by the electronics rack.

12. The cooled electronics rack of claim 9, wherein each container is sized and configured to be operatively inserted into a respective electronic system chassis of the at least one electronic system chassis is a blade center chassis, and wherein each electronic subsystem board is an immersion-cooled blade.

13. The cooled electronics rack of claim 9, wherein the coolant inlet port and the coolant outlet port are disposed in the front wall of the container, and wherein the back wall and the front wall are opposite walls of the container.

14. The cooled electronics rack of claim 9, wherein the coolant inlet port and the coolant outlet port are disposed in the back wall of the container with the hermetically sealed electrical connector, and comprise blind mate connect couplings which facilitate coupling of the container to a coolant supply line and a coolant return line, respectively.

15. The cooled electronics rack of claim 9, wherein each container is a hermetically sealable container, wherein the apparatus further comprises an outer support shell configured to surround the hermetically sealable container and be disposed within the electronics rack when the container is operatively docked therein.

16. A method of facilitating cooling of an electronic subsystem board, the method comprising:
 providing a container comprising a front wall, a back wall, and a side wall interconnecting the front wall and the back wall, the container being sized to receive through a sealable opening in the side wall thereof an electronic subsystem board, the container and the electronic subsystem board being configured for the electronic subsystem board to operatively dock within the container, the container comprising a hermetically sealed electrical connector disposed on the back wall of the container, and a coolant inlet port and a coolant outlet port coupled to the container for facilitating ingress and egress of coolant through the container, the coolant inlet port being disposed, relative to an operative position of the container, in a lower portion of the container and the coolant outlet port being disposed in an upper portion of the container, the electronic subsystem board comprising multiple different types of components to be immersion-cooled and, wherein the container is sized and configured to operatively dock in a vertical orientation within an electronics rack;
 operatively docking the electronic subsystem board within the container, wherein the hermetically sealed electrical connector is sized and configured to receive an electrical and network connector of the electronic subsystem board when the electronic subsystem board is operatively docked within the container and facilitate external electrical and network coupling thereto via the electrical backplane of the electronics rack; and
 coupling a coolant supply line to the coolant inlet port and coupling a coolant return line to the coolant outlet port to facilitate ingress and egress of coolant through the container, wherein when the coolant flows through the container, the multiple different types of components of the electronic subsystem board are immersion-cooled by the coolant, and wherein the sealable opening in the side wall of the container allows the hermetically sealed electrical connector on the back wall of the container and the coolant inlet port and the coolant outlet port secured to the container to remain structurally stationary with docking or undocking of the electronic subsystem board in the container.

17. The method of claim 16, further comprising providing an outer shell configured to surround the container and be disposed within the electronics rack when the container is operatively docked therein, the outer shell including an opening sized to accommodate the hermetically sealed electrical connector disposed on the back wall of the container, and first and second coolant port openings sized and positioned to pass therethrough the coolant inlet port and the coolant outlet port of the container, the outer shell providing added structural support for the container, and wherein the method further comprises positioning the container within the outer shell, the outer shell being configured to facilitate operative insertion of the container and immersion-cooled electronic subsystem disposed therein into the electronics rack.

18. The method of claim 16, wherein the electronics rack comprises a blade center chassis of a multi-blade center system, and wherein the electronic subsystem board is an immersion-cooled blade.

19. The method of claim 16, wherein the coolant inlet port and coolant outlet port are disposed in the front wall of the container, wherein the front wall and the back wall are opposite walls of the container, and the container is sized and configured to operatively insert into the blade center chassis of the multi-blade center system, and the method further comprises docking the container in an operative position within the blade center chassis with the hermetically sealed electrical connector operatively coupled to the blade center chassis.

20. The method of claim 16, wherein the coolant inlet port and the coolant outlet port are disposed in the back wall of the container with the hermetically sealed electrical connector, and comprise blind-mate connect couplings which facilitate coupling of the container to the coolant supply line and the coolant return line, respectively.

\* \* \* \* \*